US008775874B2

United States Patent
Chu (10) Patent No.: US 8,775,874 B2
(45) Date of Patent: Jul. 8, 2014

(54) DATA PROTECTION METHOD, AND MEMORY CONTROLLER AND MEMORY STORAGE DEVICE USING THE SAME

(75) Inventor: Chien-Hua Chu, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 170 days.

(21) Appl. No.: 13/591,236

(22) Filed: Aug. 22, 2012

(65) Prior Publication Data

US 2013/0332791 A1     Dec. 12, 2013

(30) Foreign Application Priority Data

Jun. 11, 2012  (TW) .............................. 101120906 A (51) Int. Cl.
*G06F 11/00*     (2006.01)
(52) U.S. Cl.
USPC ............. 714/36; 714/752; 714/764; 711/103; 711/106; 711/160; 365/222
(58) Field of Classification Search
None
See application file for complete search history.

(56) References Cited

U.S. PATENT DOCUMENTS

| 5,475,693 | A  | * | 12/1995 | Christopherson et al. ..... 714/710 |
| 2005/0116780 | A1 | * | 6/2005 | Endo et al. ........................ 331/2 |
| 2005/0281088 | A1 | * | 12/2005 | Ishidoshiro et al. ...... 365/185.29 |
| 2009/0172267 | A1 | * | 7/2009 | Oribe et al. .................... 711/103 |
| 2011/0138222 | A1 | * | 6/2011 | Haines et al. ................. 714/6.12 |
| 2014/0040664 | A1 | * | 2/2014 | Hida et al. ....................... 714/15 |

FOREIGN PATENT DOCUMENTS

JP          363237977 A  * 10/1988  ............... B41J 29/46

* cited by examiner

*Primary Examiner* — John Trimmings
(74) *Attorney, Agent, or Firm* — Jianq Chyun IP Office (57) ABSTRACT

A data protection method adapted to a rewritable non-volatile memory module having a plurality of physical blocks is provided. The data protection method includes following steps. If the rewritable non-volatile memory module is powered on, a power-off period from last time the rewritable non-volatile memory module is powered off till present is obtained. If the power-off period is longer than a time threshold, whether each physical block satisfies an update condition is determined according to a block information of the physical block. An update procedure is executed on the physical blocks that satisfy the update condition. The update procedure is configured to read data from a physical block and rewrite the data into one of the physical blocks. Thereby, data in the physical blocks is protected from being easily lost, and the lifespan of the rewritable non-volatile memory module is prolonged.

18 Claims, 6 Drawing Sheets

DATA PROTECTION METHOD, AND MEMORY CONTROLLER AND MEMORY STORAGE DEVICE USING THE SAME

CROSS-REFERENCE TO RELATED APPLICATION

This application claims the priority benefit of Taiwan application serial no. 101120906, filed on Jun. 11, 2012. The entirety of the above-mentioned patent application is hereby incorporated by reference herein and made a part of this specification.

BACKGROUND

1. Technology Field

The invention generally relates to a data protection method, and more particularly, to a data protection method adapted to a rewritable non-volatile memory and a memory controller and a memory storage device using the same.

2. Description of Related Art

Along with the widespread of digital cameras, cell phones, and MP3 players in recently years, the consumers' demand to storage media has increased drastically. Rewritable non-volatile memory module (for example, flash memory) is one of the most adaptable storage media to aforementioned portable multimedia devices due to its many characteristics such as data non-volatility, low power consumption, small volume, and non-mechanical structure.

A rewritable non-volatile memory module usually includes a plurality of physical blocks. Each physical block comes with an upper limit on the number of erases. If this upper limit is exceeded, data stored in the physical block may be lost or may not be kept for a long time. The service life of a rewritable non-volatile memory module is going to end if data stored in its physical blocks cannot be kept. Thereby, how to protect data stored in physical blocks that have their erase counts over the upper limit, so as to prolong the lifespan of a rewritable non-volatile memory module, has become a concern in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the invention is directed to a data protection method and a memory controller and a memory storage device using the same, in which the lifespan of a rewritable non-volatile memory module is prolonged.

An exemplary embodiment of the invention provides a data protection method adapted to a rewritable non-volatile memory module. The rewritable non-volatile memory module includes a plurality of physical blocks. The data protection method includes following steps. If the rewritable non-volatile memory module is powered on, a power-off period from a first time that the rewritable non-volatile memory module is previously powered off to a second time that the rewritable non-volatile memory module is currently powered on is obtained. If the power-off period is longer than a first time threshold, whether each of the physical blocks satisfies an update condition is determined according to a block information of the physical block. An update procedure is executed on the physical blocks satisfying the update condition. The update procedure is configured to read a first data from the physical block on which the update procedure is executed and rewrite the first data into one of the physical blocks.

An exemplary embodiment of the invention provides a memory storage device including a connector, a rewritable non-volatile memory module, and a memory controller. The connector is configured to couple to a host system. The rewritable non-volatile memory module includes a plurality of physical blocks. The memory controller is coupled to the connector and the rewritable non-volatile memory module. If the memory storage device is powered on, the memory controller obtains a power-off period from a first time that the memory storage device is previously powered off to a second time that the memory storage device is currently powered on. If the power-off period is longer than a first time threshold, the memory controller determines whether each of the physical blocks satisfies an update condition according to a block information of the physical block. The memory controller executes an update procedure on the physical blocks satisfying the update condition. The update procedure is configured to read a first data from the physical block on which the update procedure is executed and rewrite the first data into one of the physical blocks.

An exemplary embodiment of the invention provides a memory controller including a host interface, a memory interface, and a memory management circuit. The host interface is configured to couple to a host system. The memory interface is coupled to a rewritable non-volatile memory module. The rewritable non-volatile memory module includes a plurality of physical blocks. The memory management circuit is coupled to the host interface and the memory interface. If the rewritable non-volatile memory module is powered on, the memory management circuit obtains a power-off period from a first time that the rewritable non-volatile memory module is previously powered off to a second time that the rewritable non-volatile memory module is currently powered on. If the power-off period is longer than a first time threshold, the memory management circuit determines whether each of the physical blocks satisfies an update condition according to a block information of the physical block. The memory management circuit executes an update procedure on the physical blocks satisfying the update condition. The update procedure is configured to read a first data from the physical block on which the update procedure is executed and rewrite the first data into one of the physical blocks.

As described above, in a data protection method, a memory controller, and a memory storage device provided by exemplary embodiments of the invention, all or part of the physical blocks in the memory storage device are updated if the memory storage device is powered on. Accordingly, data stored in the physical blocks can be continually kept and the lifespan of the memory storage device can be prolonged.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

These and other exemplary embodiments, features, aspects, and advantages of the invention will be described and become more apparent from the detailed description of exemplary embodiments if read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage device (also referred to as a memory storage system) includes a rewritable non-volatile memory module and a controller (also referred to as a control circuit). A memory storage device is usually used with a host system so that the host system can write data into or read data from the memory storage device.

Figure 1A:
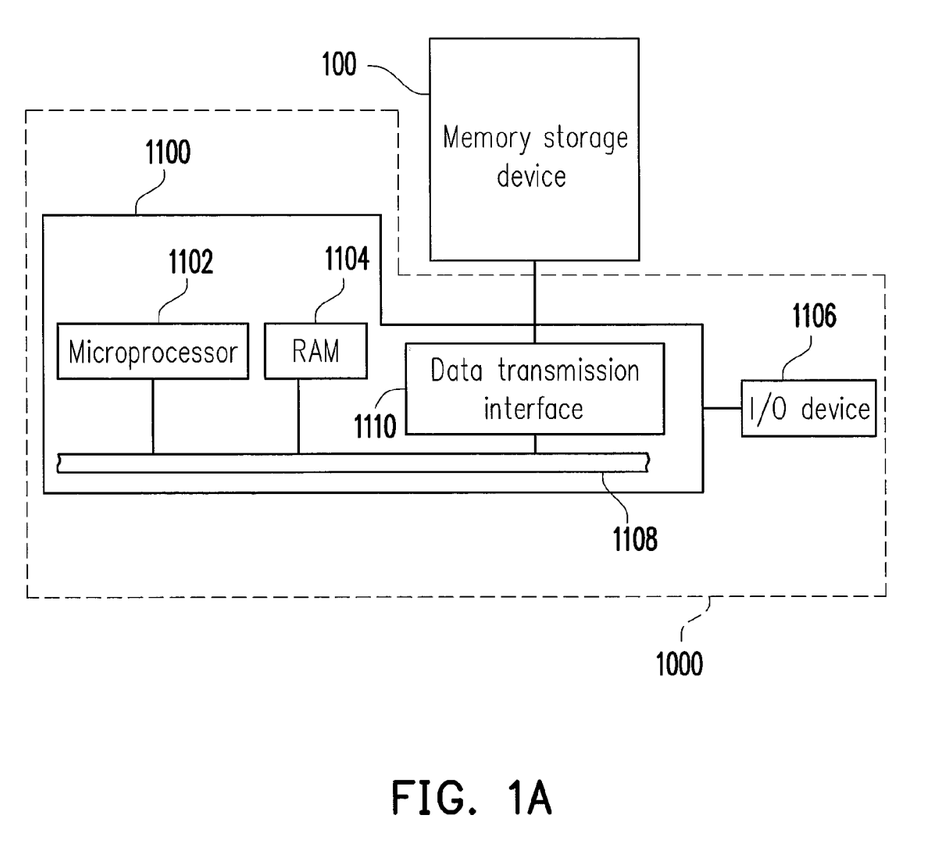
FIG. 1A illustrates a host system and a memory storage device according to an exemplary embodiment.

FIG. 1A illustrates a host system and a memory storage device according to an exemplary embodiment.

Figure 1B:
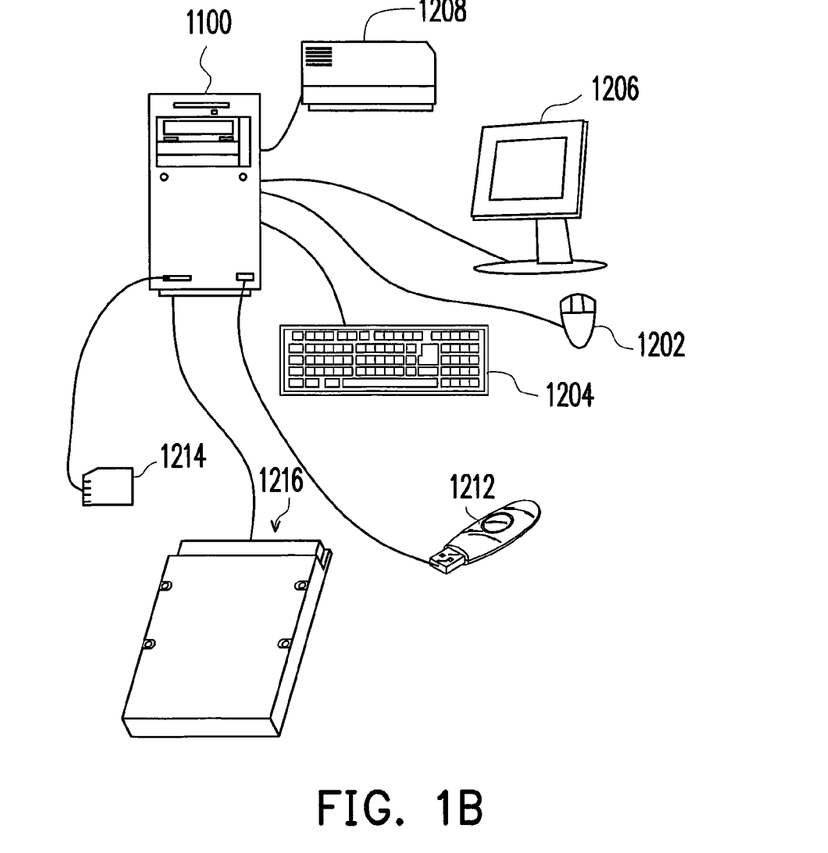
FIG. 1B is a diagram of a computer, an input/output (I/O) device, and a memory storage device according to an exemplary embodiment.

Referring to FIG. 1A, the host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. It should be understood that the I/O device 1106 is not limited to the devices illustrated in FIG. 1B and may further include other devices.

In the present embodiment, the memory storage device 100 is coupled to other components of the host system 1000 through the data transmission interface 1110. Data can be written into or read from the memory storage device 100 through the operations of the microprocessor 1102, the RAM 1104, and the I/O device 1106. The memory storage device 100 may be a rewritable non-volatile memory storage device, such as the flash drive 1212, the memory card 1214, or the solid state drive (SSD) 1216 illustrated in FIG. 1B.

Figure 1C:
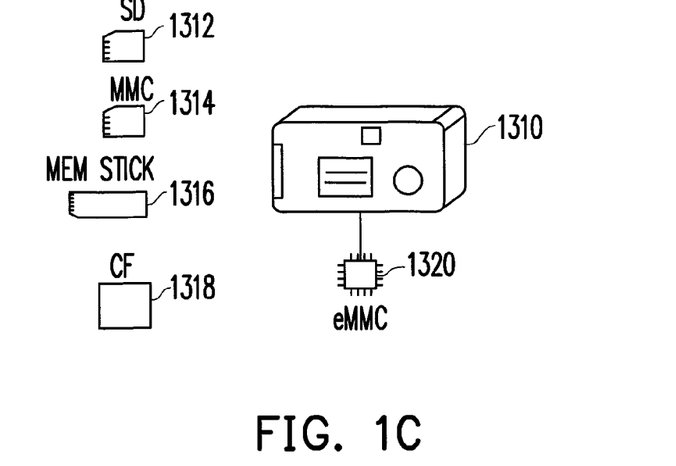
FIG. 1C is a diagram of a host system and a memory storage device according to an exemplary embodiment.

Generally speaking, the host system 1000 can be substantially any system that works with the memory storage device 100 to store data. Even tough the host system 1000 is described as a computer system in the present exemplary embodiment, in another exemplary embodiment of the invention, the host system 1000 may also be a digital camera, a video camera, a communication device, an audio player, or a video player. For example, if the host system is a digital camera (video camera) 1310, the rewritable non-volatile memory storage device is then a secure digital (SD) card 1312, a multi media card (MMC) card 1314, a memory stick (MS) 1316, a compact flash (CF) card 1318, or an embedded storage device 1320 (as shown in FIG. 1C) used by the digital camera (video camera) 1310. The embedded storage device 1320 includes an embedded MMC (eMMC). It should be mentioned that an eMMC is directly coupled to the motherboard of a host system.

Figure 2:
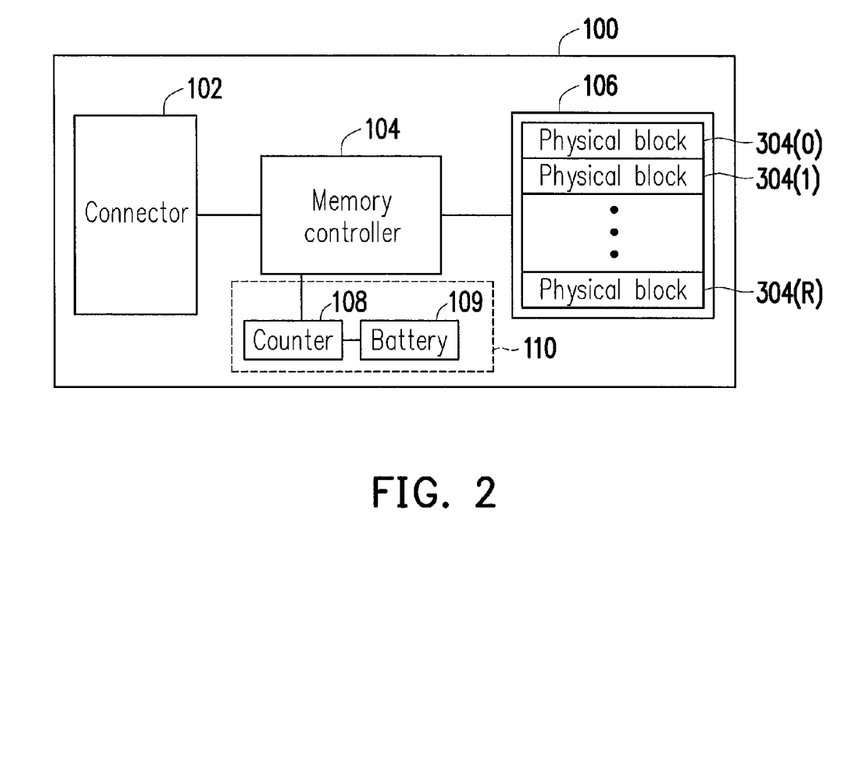
FIG. 2 is a schematic block diagram of the memory storage device in FIG. 1A.

FIG. 2 is a schematic block diagram of the memory storage device in FIG. 1A.

Referring to FIG. 2, the memory storage device 100 includes a connector 102, a memory controller 104, a rewritable non-volatile memory module 106, and a power-off period calculation unit 110.

In the present exemplary embodiment, the connector 102 complies with the serial advanced technology attachment (SATA) standard. However, the invention is not limited thereto, and the connector 102 may also comply with the parallel advanced technology attachment (PATA) standard, the Institute of Electrical and Electronic Engineers (IEEE) 1394 standard, the peripheral component interconnect (PCI) express standard, the universal serial bus (USB) standard, the secure digital (SD) interface standard, the ultra high speed-I (UHS-I) interface standard, the ultra high speed-II (UHS-II) interface standard, the memory stick (MS) interface standard, the MMC interface standard, the eMMC interface standard, the universal flash storage (UFS) interface standard, the compact flash (CF) interface standard, the integrated device electronics (IDE) standard, or any other suitable standard.

The memory controller 104 executes a plurality of logic gates or control instructions implemented in a hardware form or a firmware form and performs various data operations on the rewritable non-volatile memory module 106 according to commands issued by the host system 1000.

The rewritable non-volatile memory module 106 is coupled to the memory controller 104 and configured to store data written by the host system 1000. The rewritable non-volatile memory module 106 has physical blocks 304(0)-304(R). The physical blocks 304(0)-304(R) may belong to a same memory die or different memory dies. Each physical block has a plurality of physical pages, and each of the physical pages has at least one physical sector, wherein the physical pages belonging to the same physical block can be individually written but have to be erased all together. Each physical block may be composed of 128 physical pages, and each physical page may have 8 physical sectors. Namely, in the case that the capacity of each physical sector is 512 bytes, the capacity of each physical page is 4 kilobytes (KB). However, the invention is not limited thereto, and each physical block may also be composed of 64, 256, or any other number of physical pages.

To be specific, physical block is the smallest unit for erasing data. Namely, each physical block contains the least number of memory cells that are erased all together. Physical page is the smallest unit for programming data. Namely, physical page is the smallest unit for writing data. However, in another exemplary embodiment of the invention, the smallest unit for writing data may also be physical sector or another unit. Each physical page usually includes a data bit area and a redundant bit area. The data bit area is used for storing user data, and the redundant bit area is used for storing system data (for example, error checking and correcting (ECC) codes).

In the present exemplary embodiment, the rewritable non-volatile memory module 106 is a multi level cell (MLC) NAND flash memory module (i.e., each memory cell stores at least two bit data). However, the invention is not limited thereto, and the rewritable non-volatile memory module 106 may also be a single level cell (SLC) NAND flash memory module, a trinary level cell (TLC) NAND flash memory module, any other suitable flash memory module, or any other memory module with the same characteristics.

The power-off period calculation unit 110 provides the time that the memory storage device 100 is powered off. For example, the power-off period calculation unit 110 is implemented with a counter 108 and a battery 109. The counter 108 is coupled to the memory controller 104 and records a value. After the counter 108 is started, it constantly updates the value recorded therein. For example, the counter 108 increases the value recorded therein at intervals of a time unit. Thus, the value recorded in the counter 108 can be calculated and used for indicating a time interval. The battery 109 supplies power to the counter 108. The memory controller 104 obtains the power-off period of the memory storage device 100 by starting the counter 108 and reading the value in the counter 108.

Figure 3:
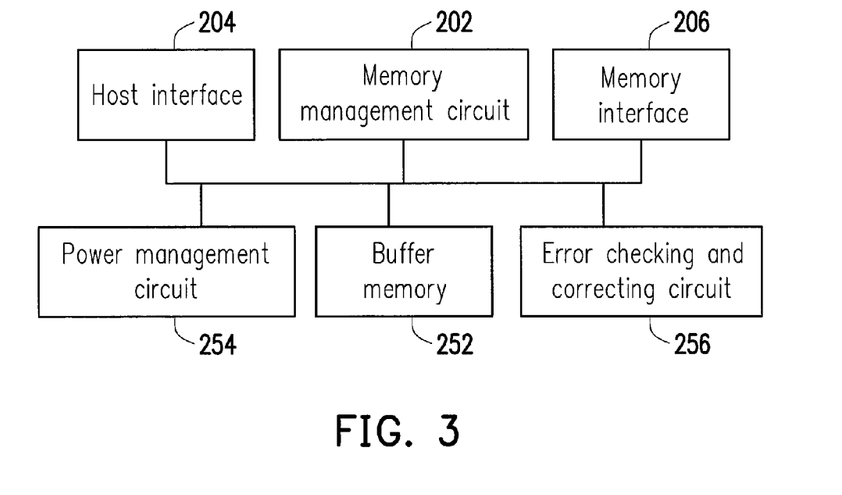
FIG. 3 is a schematic block diagram of a memory controller according to an exemplary embodiment.

FIG. 3 is a schematic block diagram of a memory controller according to an exemplary embodiment.

Referring to FIG. 3, the memory controller 104 includes a memory management circuit 202, a host interface 204, and a memory interface 206.

The memory management circuit 202 controls the overall operation of the memory controller 104. To be specific, the memory management circuit 202 has a plurality of control instructions, and if the memory storage device 100 is in operation, the control instructions are executed to perform data writing, data reading, and data erasing operations.

In the present exemplary embodiment, the control instructions of the memory management circuit 202 are implemented in a firmware form. For example, the memory management circuit 202 has a microprocessor unit (not shown) and a read-only memory (ROM, not shown), and the control instructions are burnt into the ROM. If the memory storage device 100 is in operation, the control instructions are executed by the microprocessor unit to carry out data writing, data reading, and data erasing operations.

In another exemplary embodiment of the invention, the control instructions of the memory management circuit 202 may also be stored in a specific area of the rewritable non-volatile memory module 106 (for example, a system area exclusively used for storing system data in a memory module) as program codes. In addition, the memory management circuit 202 has a microprocessor unit (not shown), a ROM (not shown), and a RAM (not shown). In particular, the ROM has a driving code segment. If the memory controller 104 is enabled, the microprocessor unit first executes the driving code segment to load the control instructions from the rewritable non-volatile memory module 106 into the RAM of the memory management circuit 202. Thereafter, the microprocessor unit runs the control instructions to perform various data operations.

In yet another exemplary embodiment of the invention, the control instructions of the memory management circuit 202 may also be implemented in a hardware form. For example, the memory management circuit 202 includes a microcontroller, a memory management unit, a memory writing unit, a memory reading unit, a memory erasing unit, and a data processing unit. The memory management unit, the memory writing unit, the memory reading unit, the memory erasing unit, and the data processing unit are coupled to the microcontroller. The memory management unit is configured to manage the physical blocks of the rewritable non-volatile memory module 106. The memory writing unit is configured to issue a write command to the rewritable non-volatile memory module 106 to write data into the rewritable non-volatile memory module 106. The memory reading unit is configured to issue a read command to the rewritable non-volatile memory module 106 to read data from the rewritable non-volatile memory module 106. The memory erasing unit is configured to issue an erase command to the rewritable non-volatile memory module 106 to erase data from the rewritable non-volatile memory module 106. The data processing unit is configured to process data to be written into and read from the rewritable non-volatile memory module 106.

The host interface 204 is coupled to the memory management circuit 202 and configured to receive and identify commands and data from the host system 1000. Namely, commands and data transmitted by the host system 1000 are transmitted to the memory management circuit 202 through the host interface 204. In the present exemplary embodiment, the host interface 204 complies with the SATA standard. However, the invention is not limited thereto, and the host interface 204 may also comply with the PATA standard, the IEEE 1394 standard, the PCI express standard, the USB standard, the SD standard, the MS standard, the MMC standard, the CF standard, the IDE standard, or any other suitable data transmission standard.

The memory interface 206 is coupled to the memory management circuit 202 and configured to access the rewritable non-volatile memory module 106. Namely, data to be written into the rewritable non-volatile memory module 106 is converted by the memory interface 206 into a format acceptable to the rewritable non-volatile memory module 106.

In an exemplary embodiment of the invention, the memory controller 104 further includes a buffer memory 252, a power management circuit 254, and an ECC circuit 256.

The buffer memory 252 is coupled to the memory management circuit 202 and configured to temporarily store data and commands from the host system 1000 or data from the rewritable non-volatile memory module 106.

The power management circuit 254 is coupled to the memory management circuit 202 and configured to control the power supply of the memory storage device 100.

The ECC circuit 256 is coupled to the memory management circuit 202 and configured to execute an ECC procedure to ensure data accuracy. To be specific, if the memory management circuit 202 receives a write command from the host system 1000, the ECC circuit 256 generates a corresponding ECC code for the data corresponding to the write command, and the memory management circuit 202 writes the data corresponding to the write command and the corresponding ECC code into the rewritable non-volatile memory module 106. Subsequently, if the memory management circuit 202 reads the data from the rewritable non-volatile memory module 106, it also reads the ECC code corresponding to the data, and the ECC circuit 256 executes the ECC procedure on the data according to the ECC code.

If the memory storage device 100 is coupled to the host system 1000, the host system 1000 supplies power to various components (for example, the memory controller 104 and the rewritable non-volatile memory module 106) in the memory storage device 100. Contrarily, if the connection between the memory storage device 100 and the host system 1000 is cut off, various components of the memory storage device 100 are powered off. In the present exemplary embodiment, the memory management circuit 202 calculates a power-off period during which no power is supplied to the memory storage device 100. If the power-off period exceeds a time threshold, the memory management circuit 202 further determines whether each physical block satisfies an update condition. Besides, the memory management circuit 202 executes an update procedure on those physical blocks satisfying the update condition to rewrite the data stored in these physical blocks.

To be specific, if the memory storage device 100 is powered off (the current time is referred to as a first time), the memory management circuit 202 starts the counter 108. Then, the counter 108 constantly updates the value recorded therein. If the memory storage device 100 is powered off, the battery 109 supplies power to the counter 108. Thus, the counter 108 can work properly even if the host system 1000 does not supply any power to the memory storage device 100.

Next, if the memory storage device 100 is re-connected to the host system 1000 (or coupled to another electronic device that can supply power), the memory storage device 100 and various components thereof are powered on. At this time (referred to as a second time), the memory management circuit 202 reads the value recorded in the counter 108 and calculates a power-off period according to the value recorded in the counter 108. The power-off period represents the duration from the first time to the second time. In other words, the memory management circuit 202 can obtain the power-off period from the first time that the rewritable non-volatile memory module 106 is previously powered off to the second time that the rewritable non-volatile memory module 106 is currently powered on according to the value recorded in the counter 108.

The memory management circuit 202 determines whether the power-off period exceeds a time threshold (also referred to as a first time threshold). If the power-off period exceeds the time threshold, the memory management circuit 202 determines whether the physical blocks 304(0)-304(R) satisfy an update condition according to block information (for example, erase counts, ECCs, or read counts) of the physical blocks. If a physical block satisfies the update condition, data stored in this physical block may be lost or error may be produced. In the present exemplary embodiment, the memory management circuit 202 executes an update procedure on those physical blocks satisfying the update condition. The update procedure is configured to read data from a physical block and rewrite the data into one of the physical blocks 304(0)-304(R).

For example, the memory management circuit 202 obtains the erase count of each physical block. If the memory management circuit 202 determines that the power-off period exceeds the first time threshold, it determines that a physical block satisfies the update condition if the erase count of the physical block exceeds an erase threshold. In the present exemplary embodiment, the first time threshold is set to 1 month, and the erase threshold is the upper limit on number of erases (for example, 100,000 times) of a physical block. However, the invention is not limited thereto, and in other exemplary embodiments, the first time threshold and the erase threshold may also be set to other values.

Figure 4:
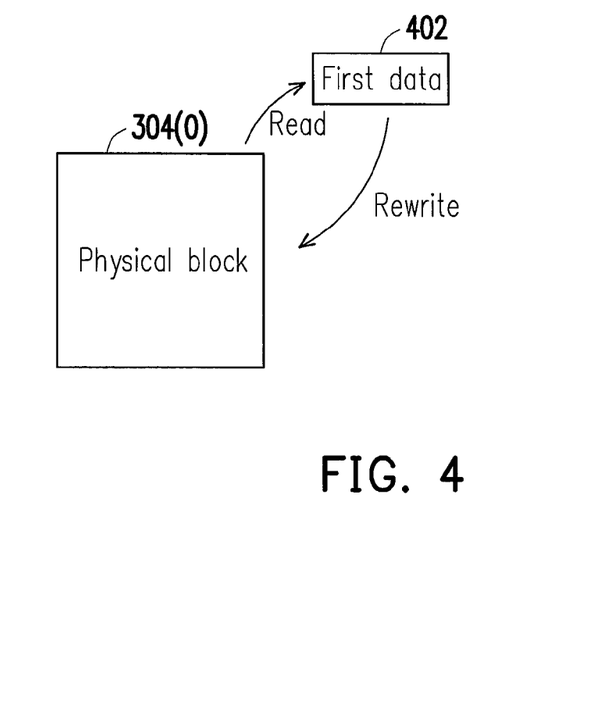
FIG. 4 and FIG. 5 are diagrams illustrating an example of executing an update procedure on a physical block according to an exemplary embodiment.
Figure 5:
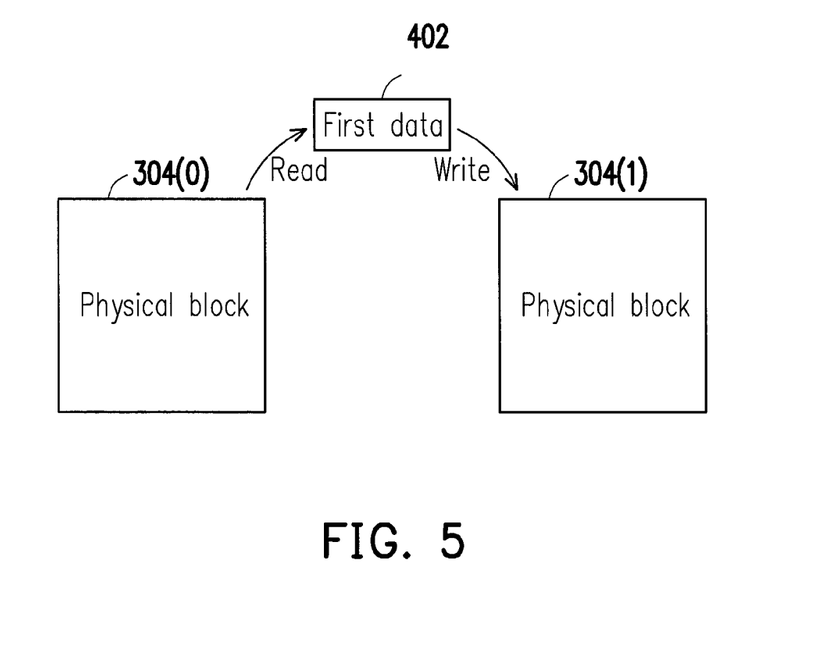

FIG. 4 and FIG. 5 are diagrams illustrating an example of executing an update procedure on a physical block according to an exemplary embodiment.

Referring to FIG. 4, it is assumed herein that if the memory storage device 100 is powered on again, the memory management circuit 202 determines that the power-off period exceeds the first time threshold and the erase count of the physical block 304(0) exceeds the erase threshold. Namely, the physical block 304(0) satisfies the update condition. Herein the memory management circuit 202 reads a first data 402 stored in the physical block 304(0) into the buffer memory 252 and executes an erase command on the physical block 304(0). Next, the memory management circuit 202 rewrites the first data 402 into the physical block 304(0). Thereby, the operation of executing an update procedure on the physical block 304(0) is completed. However, the invention is not limited thereto, and the memory management circuit 202 may also write the first data 402 into another physical block. In another exemplary embodiment, as shown in FIG. 5, the memory management circuit 202 writes the first data 402 into the physical block 304(1).

Additionally, in another exemplary embodiment, the memory management circuit 202 first determines whether the power-off period is longer than a second time threshold, and if the power-off period is not longer than the second time threshold, then determines whether the power-off period exceeds the first time threshold. The second time threshold is greater than the first time threshold. In the present exemplary embodiment, the second time threshold is set to 1 year. If the power-off period is longer than the second time threshold, data stored in the physical blocks 304(0)-304(R) has not been updated for a long time therefore may be lost or have errors. Thus, while determining whether the power-off period is longer than the second time threshold, the memory management circuit 202 determines whether all the physical blocks 304(0)-304(R) satisfy the update condition. In other words, the memory management circuit 202 executes the update procedure on all the physical blocks 304(0)-304(R). However, the invention is not limited thereto, and in other exemplary embodiments, the second time threshold may also be set to other values.

On the other hand, in the present exemplary embodiment, whether the update procedure should be executed is determined according to erase count. However, the invention is not limited thereto. Because each erase operation is to allow a physical block to accept a next write operation, in another exemplary embodiment, the write count of each physical block may be calculated and used for replacing the erase count.

Besides determining whether a physical block satisfies an update condition according to the power-off period and the erase count, in another exemplary embodiment, the memory management circuit 202 further determines whether a physical block satisfies the update condition according to whether an error occurs in the data stored in the physical block. To be specific, each physical block includes a plurality of physical pages, and each physical page includes a data bit area and a redundant bit area. The data bit area is used for storing user data, and the redundant bit area is used for storing system data. For example, the redundant bit area can store an error correction code (ECC). Herein the ECC is corresponding to the data in the data bit area. The memory management circuit 202 can determine whether an error occurs in the data in the data bit area according to the ECC in the redundant bit area.

Figure 6:
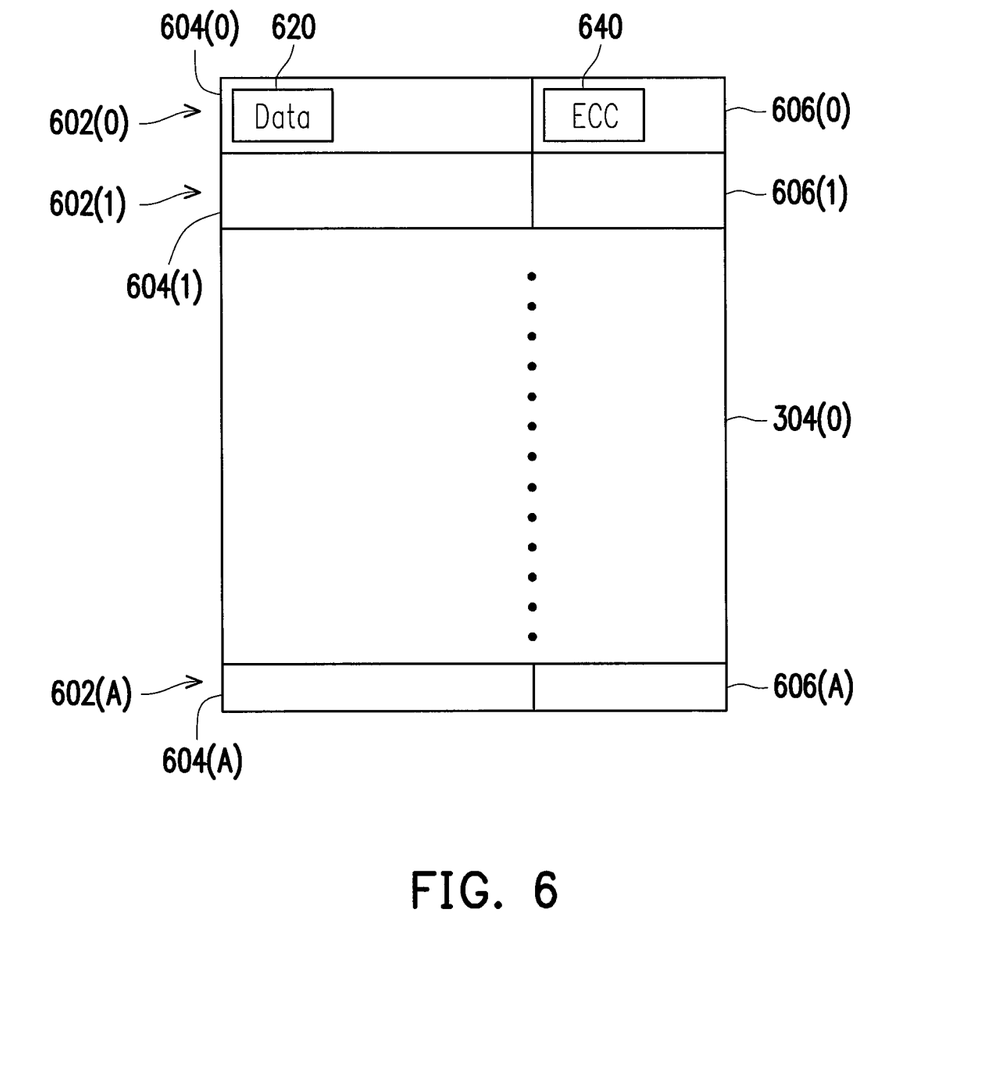
FIG. 6 is a diagram illustrating an example of determining whether an error occurs in a data by using an error correction code (ECC) according to an exemplary embodiment.

FIG. 6 is a diagram illustrating an example of determining whether an error occurs in a data by using an ECC according to an exemplary embodiment.

Referring to FIG. 6, the physical block 304(0) includes physical pages 602(0)-602(A), data bit areas 604(0)-604(A), and redundant bit areas 606(0)-606(A).

For example, the physical page 602(0) includes the data bit area 604(0) and the redundant bit area 606(0), and the physical page 602(1) includes the data bit area 604(1) and the redundant bit area 606(1). Data 620 is stored in the data bit area 604(0), and an ECC 640 is stored in the redundant bit area 606(0). The ECC 640 is used for determining whether an error occurs in the data 620, and if the number of erroneous bits in the data 620 does not exceed the upper limit on the number of bits corrected by the ECC 640, the ECC 640 can also be used for correcting the error in the data 620. In the present exemplary embodiment, the memory management circuit 202 determines whether a correctable error occurs according to the ECC 640 and the data 620. The correctable error indicates that the number of erroneous bits in the data 620 does not exceed the upper limit on the correctable bit number of the ECC 640. Because the physical page 602(0) having the correctable error belongs to the physical block 304(0), the memory management circuit determines that the physical block 304(0) satisfies the update condition and executes the update procedure on the physical block 304(0). In other words, the memory management circuit 202 determines that the physical blocks corresponding to the physical pages having correctable errors satisfy the update condition.

In the present exemplary embodiment, the power-off period calculation unit 110 is implemented with a counter 108 and a battery 109. However, in another exemplary embodiment, the power-off period calculation unit 110 may also be implemented as a timer (not shown). The timer can be disposed in the host system 1000 or the memory storage device 100 and can be realized as an application program or a hardware circuit. For example, if the connection between the memory storage device 100 and the host system 1000 is cut off (the current time is referred to as a first time), an application program in the host system 1000 starts timing. If next time the memory storage device 100 is coupled to the host system 1000 (the current time is referred to as a second time), the application program identifies the memory storage device 100 and calculates the power-off period between the first time and the second time. Thereafter, the application program transmits a power-off period information to the memory management circuit 202. The power-off period information contains the power-off period. Thus, the memory management circuit 202 can obtain the power-off period according to the power-off period information.

Figure 7:
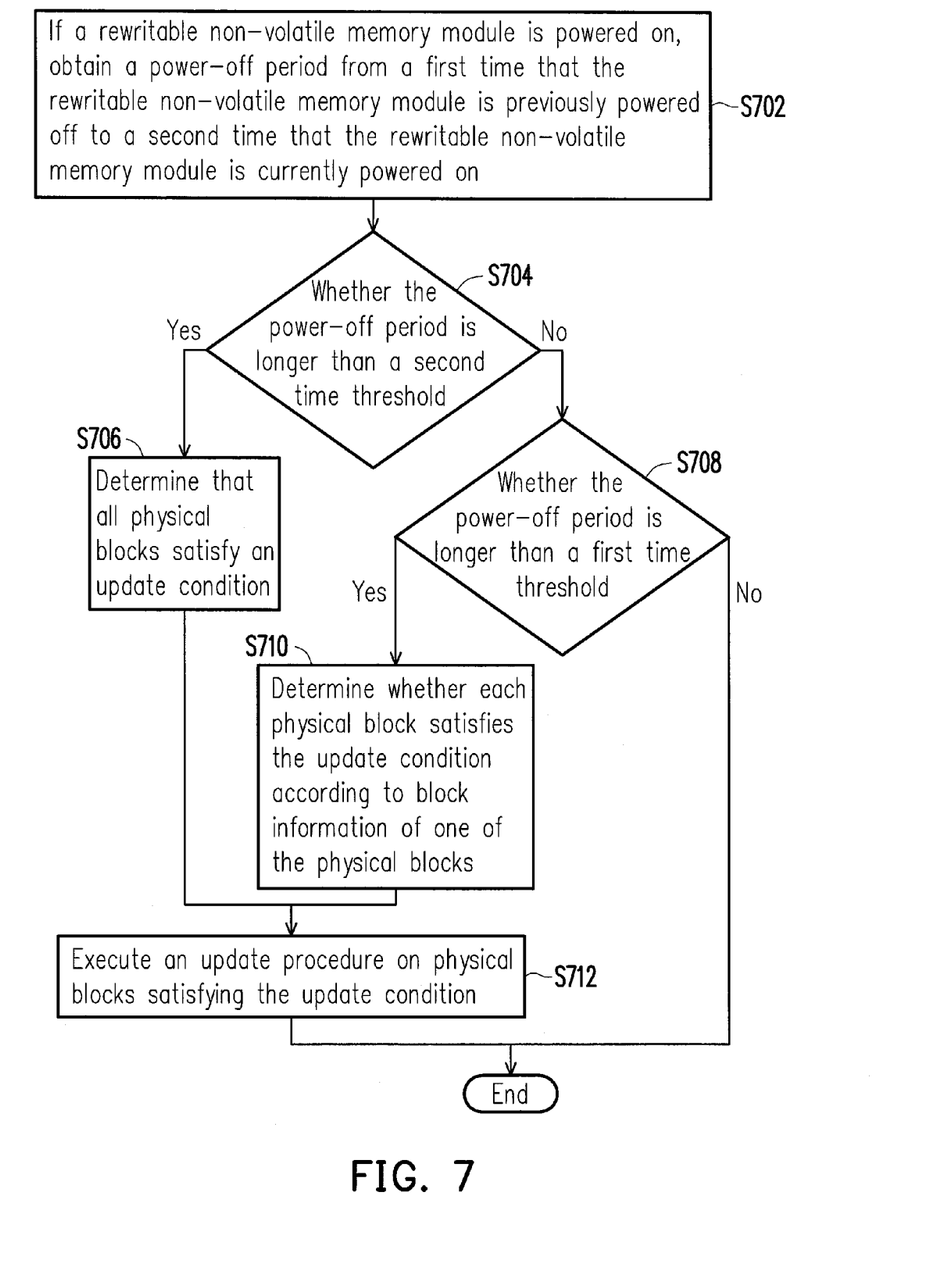
FIG. 7 is a flowchart of a data protection method according to an exemplary embodiment.

FIG. 7 is a flowchart of a data protection method according to an exemplary embodiment.

Referring to FIG. 7, in step S702, if the rewritable non-volatile memory module is powered on, the memory management circuit 202 obtains a power-off period from the first time that the rewritable non-volatile memory module is previously powered off to the second time that the rewritable non-volatile memory module is currently powered on.

In step S704, the memory management circuit 202 determines whether the power-off period is longer than the second time threshold.

If the power-off period is longer than the second time threshold, in step S706, the memory management circuit 202 determines that all the physical blocks satisfy the update condition.

If the power-off period is not longer than the second time threshold, in step S708, the memory management circuit 202 determines whether the power-off period is longer than the first time threshold.

If the power-off period is longer than the first time threshold, in step S710, the memory management circuit 202 determines whether each physical block satisfies the update condition according to the block information of one of the physical blocks. Contrarily, if the power-off period is not longer than the first time threshold, the memory management circuit 202 ends the current procedure.

In step S712, the memory management circuit 202 executes an update procedure on those physical blocks satisfying the update condition.

Various steps in FIG. 7 have been described above in detail therefore will not be described herein.

As described above, in a data protection method, a memory controller, and a memory storage device provided by exemplary embodiments of the invention, a power-off period is obtained if the memory storage device is powered on again. Besides, whether an update procedure needs to be executed on the physical blocks is determined according to the length of the power-off period, the erase counts of the physical blocks, or whether any correctable error occurs. Thus, data stored in the physical blocks is rewritten if the memory storage device is powered on. Thereby, data stored in the physical blocks is protected from being lost, and the lifespan of the rewritable non-volatile memory is prolonged.

The previously described exemplary embodiments of the present invention have the advantages aforementioned, wherein the advantages aforementioned not required in all versions of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data protection method, for a rewritable non-volatile memory module, wherein the rewritable non-volatile memory module comprises a plurality of physical blocks, the data protection method comprising:
   if the rewritable non-volatile memory module is powered on, obtaining a power-off period from a first time that the rewritable non-volatile memory module is previously powered off to a second time that the rewritable non-volatile memory module is currently powered on;
   if the power-off period is longer than a first time threshold, determining whether each of the physical blocks satisfies an update condition according to a block information of one of the physical blocks;
   executing an update procedure on the physical blocks satisfying the update condition, wherein the update procedure is configured to read a first data from the one of the physical blocks on which the update procedure is executed and rewrite the first data into the one of the physical blocks.

2. The data protection method according to claim 1, wherein the block information is an erase count, and the step of determining whether each of the physical blocks satisfies the update condition according to the block information of the one of the physical blocks comprises:
   determining that the one of the physical blocks satisfies the update condition if the erase count of the one of the physical blocks is greater than an erase threshold.

3. The data protection method according to claim 1 further comprising:

if the power-off period is longer than a second time threshold, determining that all the physical blocks satisfy the update condition.

4. The data protection method according to claim 1, wherein the block information is an error correction code (ECC), each of the physical blocks comprises a plurality of physical pages, each of the physical pages comprises a data bit area and a redundant bit area, and the redundant bit area is used for recording the ECC, wherein the step of determining whether each of the physical blocks satisfies the update condition according to the block information of the one of the physical blocks comprises:
  determining whether a correctable error occurs in each of the physical pages according to data stored in the data bit area and the ECC, wherein the correctable error indicates that an error occurs in the data stored in the data bit area but the data stored in the data bit area can be corrected according to the ECC; and
  if the correctable error occurs, determining that the physical block corresponding to the physical page having the correctable error satisfies the update condition.

5. The data protection method according to claim 1, wherein the step of obtaining the power-off period comprises:
  if the rewritable non-volatile memory module is powered off, setting a counter to start updating a value recorded in the counter; and
  if the rewritable non-volatile memory module is powered on, obtaining the power-off period according to the value recorded in the counter.

6. The data protection method according to claim 1, wherein the step of obtaining the power-off period comprises:
  if the rewritable non-volatile memory module is powered on, obtaining the power-off period by using a power-off period calculation unit.

7. A memory storage device, comprising:
  a connector, configured to couple to a host system;
  a rewritable non-volatile memory module, comprising a plurality of physical blocks; and
  a memory controller, coupled to the connector and the rewritable non-volatile memory module,
  wherein if the memory storage device is powered on, the memory controller is configured to obtain a power-off period from a first time that the memory storage device is previously powered off to a second time that the memory storage device is currently powered on,
  wherein if the power-off period is longer than a first time threshold, the memory controller is configured to determine whether each of the physical blocks satisfies an update condition according to a block information of one of the physical blocks,
  wherein the memory controller is configured to execute an update procedure on the physical blocks satisfying the update condition, wherein the update procedure is configured to read a first data from the one of the physical blocks on which the update procedure is executed and rewrite the first data into the one of the physical blocks.

8. The memory storage device according to claim 7, wherein the block information is an erase count, and the memory controller is further configured to determine that the one of the physical blocks satisfies the update condition if the erase count of the one of the physical blocks is greater than an erase threshold.

9. The memory storage device according to claim 7, wherein if the power-off period is longer than a second time threshold, the memory controller is further configured to determine that all the physical blocks satisfy the update condition.

10. The memory storage device according to claim 7, wherein the block information is an ECC, each of the physical blocks comprises a plurality of physical pages, each of the physical pages comprises a data bit area and a redundant bit area, and the redundant bit area is used for recording the ECC,
  the memory controller is further configured to determine whether a correctable error occurs in each of the physical pages according to data stored in the data bit area and the ECC, wherein the correctable error indicates that an error occurs in the data stored in the data bit area but the data stored in the data bit area can be corrected according to the ECC,
  if the correctable error occurs, the memory controller is further configured to determine that the physical block corresponding to the physical page having the correctable error satisfies the update condition.

11. The memory storage device according to claim 7 further comprising:
  a counter, coupled to the memory controller; and
  a battery, supplying a power to the counter,
  wherein if the memory storage device is powered off, the memory controller is further configured to set the counter to start updating a value recorded in the counter,
  wherein if the memory storage device is powered on, the memory controller is further configured to obtain the power-off period according to the value recorded in the counter.

12. The memory storage device according to claim 7, wherein if the memory storage device is powered on, the memory controller is further configured to obtain the power-off period through a power-off period calculation unit.

13. A memory controller, comprising:
  a host interface, configured to couple to a host system;
  a memory interface, coupled to a rewritable non-volatile memory module, wherein the rewritable non-volatile memory module comprises a plurality of physical blocks; and
  a memory management circuit, coupled to the host interface and the memory interface,
  wherein if the rewritable non-volatile memory module is powered on, the memory management circuit is configured to obtain a power-off period from a first time that the rewritable non-volatile memory module is previously powered off to a second time that the rewritable non-volatile memory module is currently powered on,
  wherein if the power-off period is longer than a first time threshold, the memory management circuit is configured to determine whether each of the physical blocks satisfies an update condition according to a block information of one of the physical blocks,
  wherein the memory management circuit is configured to execute an update procedure on the physical blocks satisfying the update condition, wherein the update procedure is configured to read a first data from the one of the physical blocks on which the update procedure is executed and rewrite the first data into the one of the physical blocks.

14. The memory controller according to claim 13, wherein the block information is an erase count, and the memory management circuit is further configured to determine that the one of the physical blocks satisfies the update condition if the erase count of the one of physical blocks is greater than an erase threshold.

15. The memory controller according to claim 13, wherein if the power-off period is longer than a second time threshold, the memory management circuit is further configured to determine that all the physical blocks satisfy the update condition.

16. The memory controller according to claim 13, wherein the block information is an ECC, each of the physical blocks comprises a plurality of physical pages, each of the physical pages comprises a data bit area and a redundant bit area, and the redundant bit area is used for recording the ECC, the memory management circuit is further configured to determine whether a correctable error occurs in each of the physical pages according to data stored in the data bit area and the ECC, wherein the correctable error indicates that an error occurs in the data stored in the data bit area but the data stored in the data bit area can be corrected according to the ECC, if the correctable error occurs, the memory management circuit is further configured to determine that the physical block corresponding to the physical page having the correctable error satisfies the update condition.

17. The memory controller according to claim 13, wherein if the rewritable non-volatile memory module is powered off, the memory management circuit is further configured to set a counter to start updating a value recorded in the counter, if the rewritable non-volatile memory module is powered on, the memory management circuit is further configured to obtain the power-off period according to the value recorded in the counter.

18. The memory controller according to claim 13, wherein if the rewritable non-volatile memory module is powered on, the memory management circuit is further configured to obtain the power-off period through a power-off period calculation unit.

* * * * *